March 24, 1959 S. PAKSWER ET AL 2,879,182

PHOTOSENSITIVE DEVICES

Filed Oct. 23, 1957 4 Sheets-Sheet 1

SERGE PAKSWER
CONSTANTIN S. SZEGHO
*INVENTORS.*

*BY* John J. Pederson
THEIR ATTORNEY.

March 24, 1959 S. PAKSWER ET AL 2,879,182

PHOTOSENSITIVE DEVICES

Filed Oct. 23, 1957 4 Sheets-Sheet 2

SERGE PAKSWER
CONSTANTIN S. SZEGHO
*INVENTORS.*

BY John J. Pederson

THEIR ATTORNEY.

SERGE PAKSWER
CONSTANTIN S. SZEGHO
*INVENTORS.*

BY John J. Pederson
THEIR ATTORNEY.

SERGE PAKSWER
CONSTANTIN S. SZEGHO
*INVENTORS.*

BY John J. Pederson

THEIR ATTORNEY.

2,879,182

PHOTOSENSITIVE DEVICES

Serge Pakswer, Elmhurst, and Constantin S. Szegho, Chicago, Ill., assignors to The Rauland Corporation, a corporation of Illinois Application October 23, 1957, Serial No. 691,947

26 Claims. (Cl. 117—201)

This invention is directed to photosensitive devices and to improvements in the art of manufacturing such devices. More particularly, the invention is concerned with photosensitive cells of the photoconductive type in which the photoconductor comprises sintered cadmium sulfide, cadmium selenide, or a mixture of the two and with novel techniques for producing these photoconductive cells. This application is a continuation-in-part of the copending application of Serge Pakswer and Constantin S. Szegho, Serial No. 588,517, filed May 31, 1956, for "Photosensitive Devices," and assigned to the same assignee as the present application.

In general, it may be stated that there are several different known methods for manufacturing photosensitive cadmium sulfide devices. In one process, the cadmium sulfide is evaporated onto a suitable substrate such as glass to form the desired photoconductive layer. Cadmium sulfide photocells may also be fabricated by applying the photosensitive cadmium sulfide powder obtained by normal fluorescent powder manufacturing methods to a substrate; a binder for the powder may be required. These two methods produce cells having carrier mobilities within the photoconductive material of the order of one volt/cm.$^2$ sec. Another conventional process for producing cadmium sulfide photocells utilizes a technique of growing single crystals from a vapor phase; the individual cells comprise sections of a single cadmium sulfide crystal. In still another known method for preparing photoconductive cadmium sulfide cells, specially prepared cadmium sulfide powder is sintered onto a suitable substrate. These latter two methods produce cells having carrier mobilities of the order of 100 volts/cm.$^2$ sec. Since the conductivity of a cell is directly proportional to the carrier mobility of the photosensitive material, the single-crystal and sintered CdS cells having a much higher sensitivity than cells produced by the first two processes.

Sintered cadmium sulfide cells are a relatively recent development; very little descriptive material on the processing involved is available in the technical literature at this time. From a manufacturing standpoint, the sintering process is much preferable to the method requiring growth of single cadmium sulfide crystals, since the latter procedure is much more expensive and time consuming and must be critically controlled to achieve any useful degree of uniformity in cell characteristics. Furthermore, the size of the sensitive area is limited in the case of crystals whereas large area cells can be made by sintering techniques.

It is an object of the invention, therefore, to provide a new and improved method of manufacturing cadmium sulfide photoconductive devices.

It is a further object of the invention to provide a method of manufacturing photoconductive devices which are relatively stable in sensitivity and in their "dark" or unilluminated impedance.

It is an additional object of the invention to provide a new and improved method of manufacturing sintered photosensitive cadmium sulfide impedance devices which is relatively economical.

It is a specific object of the invention to provide methods of controlling the sensitivity.

It is still another object of the invention to provide a method of manufacturing cadmium sulfide photocells which exhibit large sensitivity to radiation in the red portion of the spectrum.

It is a corollary object of the invention to provide a new and improved photoconductive device which is simple and economical to manufacture and which exhibits a relatively broad spectral response.

It is a further object of the invention to provide a new and improved method of manufacturing photoconductive devices in which the photosensitive material comprises cadmium selenide.

It is another object of the invention to provide a new and improved sintering process which effectively permits conjoint use of cadmium selenide and cadmium sulfide in a single sintered layer.

It is a further object of the invention to provide a method of improving the sensitivity and stability of sintered cadmium selenide-cadmium sulfide cells.

It is an additional object of the invention to provide a method of fixing the spectral response peak of photoconductive cells at any wavelength within a relatively broad range.

It is a corollary object of the inventiton to provide a new and improved sintered photoconductive device having a spectral response peaked in the range of 5100–7200 Angstroms.

A photosensitive impedance device is manufactured in accordance with the invention by coating a substrate with a photoconductor consisting primarily of at least one compound from the group consisting of cadmium sulfide and cadmium selenide. The photoconductor includes minor portions of a donor element selected from the group consisting of elements from the third and seventh column of the Periodic Table and of an inhibitor element selected from the group consisting of copper, silver and manganese. The thus coated substrate then is fired in an atmosphere controlled by the presence of at least one of the compounds and at a temperature above 650° C. for a period of time sufficient to sinter the photoconductor coating to the substrate and to develop photoconductive properties in the coating. Two spaced conductive elements are applied to the photoconductor to form a pair of electrodes electrically interconnected by the sintered photoconductive coating.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Pure cadmium sulfide and cadmium selenide are insulators and have a resistance of the order of $10^{12}$ ohm centimeters. In order to produce an impedance device capable of translating useful currents, the resistivity of the CdS and/or CdSe must be substantially decreased. The reduction in impedance may be accomplished by introducing into the insulator material donor impurities; these donor impurities comprise elements from the groups in the periodic system immediately adajcent and to the right of either of the two components of the insulator compound. In other words, since cadmium is in the second column of the periodic table and sulfur and selenium are in the sixth column, donor impurities may be selected from the third and seventh columns of the periodic table. These donor impurities increase both the "dark" or unilluminated current and the photoconductive current which may be translated through the CdS or CdSe photoconductor.

Some other impurities, including copper, silver and manganese counteract the action of the donor impurities; they tend to decrease the "dark" conductivity and the photoconductivity of the material. These impurities, sometimes referred to hereinafter as "inhibitors" or "inhibitor impurities," also influence the decay time of the photoconductive current in the cell. In sintered cells of the type described hereinafter, both types of impurities are employed conjointly to achieve the desired electrical characteristics in the finished cells. In most instances, chlorine is utilized as the donor impurity and copper is used as the inhibitor impurity.

Figure 1:
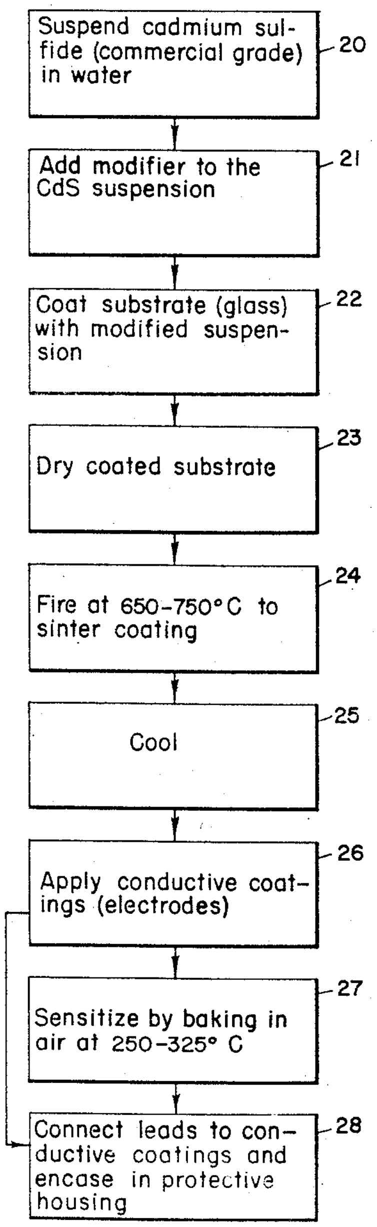
Figure 1 is a flow chart of one embodiment of the invention applicable to the manufacture of sintered photo conductive cells.

The flow chart of Figure 1 illustrates the process steps in one embodiment of the invention in which cadmium sulfide is utilized as the photoconductive material. In the first step of the process, indicated by reference numeral 20, CdS powder is suspended in water to form a relatively thick slurry or paste. To this cadimum sulfide suspension there is added one or more modifiers, as indicated in step 21; usually, the modifier is added in the form of cupric chloride. The modifier suspension formed in step 21 is then applied to a suitable substrate, usually glass, in step 22 and then dried in step 23. Application of the suspension to the substrate may be accomplished by painting, spraying, silk screening, or any equivalent technique. After coating with the modified suspension and drying, the substrate is fired at a temperature within the range of 650 to 750 C. in step 24 to sinter the CdS coating and bond it to the substrate. After sintering, the device is cooled in step 25, preferably to a temperature approximating room temperature.

Two conductive coatings or electrodes are applied to the sintered cadmium sulfide; a gap is left between the two electrodes to form the desired photosensitive impedance (step 26). The cells may then be sensitized by baking preferably in air at a temperature of 250 to 325° C. as indicated in step 27. In some instances, sensitizing step 27 may be omitted from the process, although this may result in a substantial reduction in sensitivity in the finished photocell. Moreover, sensitizing step 27 may be carried out before the electrodes are applied to the cell, although it is preferable to retain the processing sequence shown in the flow chart for reasons made apparent in the detailed description of a typical process set forth hereinafter. After the conductive electrodes have been applied to the sintered CdS coating, and the cells have been sensitized, suitable electrically conductive leads are connected to the electrode and the cell is encased in a suitable protective housing, step 28.

In order to provide a more comprehensive picture of the invention and of the individual steps set forth above in connection with the flow chart of Figure 1, a detailed description of each of those steps for a typical process is set forth hereinafter. This material is presented solely by way of illustration and in no sense as a limitation upon the invention.

*Preparation of* CdS *suspension (steps 20 and 21)*

The CdS suspension is prepared from a commercial fluorescent grade precipitated CdS powder which has not been converted to fluorescent powder by the usual baking and crystallization procedures. Several different sources of supply for this material are available, including E. I. du Pont de Nemours and Company and the New Jersey Zinc Company. The initial material contains a substantial quantity of donor impurities and requires addition of inhibitor impurities as noted above. When copper is selected as the inhibitor, it may be added to the CdS in the form of copper sulfate or any other soluble or semi-soluble copper salt. It may also be necessary to add additional quantities of the donor impurities; these may be conveniently added in the form of cupric chloride or some other halide. A typical modified suspension contains approximately $1\times10^{-3}$ gram chlorine per gram CdS and $2\times10^{-3}$ copper per gram CdS. The suspension should include sufficient water so that it will have the right consistency for the application technique selected. The suspended materials tend to settle out of the suspension; consequently, the suspension should be agitated vigorously before each use and should be kept in a closed container to prevent evaporation. In the event that some evaporation occurs, water may be added to bring the suspension back to the desired working consistency. Approximately the desired working consistency for brush painting may be obtained with about 2 cc. of water per gram of CdS powder, but this may be varied to provide the best consistency for any given coating technique.

*Coating of substrate (steps 22 and 23)*

In a typical cell structure, the substrate comprises a glass disc having a diameter of approximately 10.4 millimeters and a thickness of approximately 2.5 mm. The modified suspension prepared as indicated above is applied with a paint brush to the glass substrate in a strip approximately five millimeters wide extending completely across one face of the glass disc. After the CdS coating has been applied, the discs are dried in air at approximately 100° C. and are then ready for sintering. The drying temperature is not critical.

*Sintering of* CdS *coating (step 24)*

The firing process employed to sinter the CdS coating to the glass substrate is in some respects similar to standard procedures employed in the manufacture of fluorescent CdS powder. In this procedure, the firing of the CdS coating is carried out in an atmosphere largely governed by the presence of additional CdS powder. The firing crucible is more completely described hereinafter in connection with Figure 3, but at this juncture is sufficient to say that the coated discs are preferably mounted within an enclosed crucible and are completely surrounded by CdS; commercial grade cadmium sulfide may be used for this purpose. The crucible is then placed in an oven which has been preheated to approximately 600° C.; the temperature in the oven is immediately raised to the sintering range of 650 to 750° C. The sintering temperature is quite critical and must be maintained within a 10 to 20° C. range throughout the sintering process; usually, the optimum temperature is approximately 710° C. Because the critical temperature range is dependent upon the type of oven used used and the type of packing employed for the crucible, it should be determined empirically for each individual manufacturing set-up. The firing time for sintering is also dependent upon the size of the crucible and the amount of CdS packing; in general, the firing time may be of the order of one-half to two or more hours. It should be noted that, although this time may vary substantially for different types of processing equipment, it is relatively critical, since sensitivity, dark conductivity, and decay time of the cells all increase with increases in firing time. Accordingly, trial runs should be made for any given pocessing equipment to determine the optimum firing time to achieve a proper balance between these factors.

*Cooling and application of electrodes (steps 25 and 26)*

At the end of sintering or firing step 24, the crucible containing the glass substrate to which the CdS has been sintered is immediately removed from the oven and allowed to cool in air at ambient temperature. This cooling procedure is not critical and may be accelerated by moderate additional cooling procedures such as blowing cool air across the sintered material. After cooling, the coated discs are removed from the crucible and electrodes are applied to the sintered CdS coating by painting two separated areas of the coating and the adjacent areas of the substrate with an air-drying silver paste; a suitable silver paste for this purpose is manufactured by the E. I. du Pont de Nemours and Company and identified by that company as No. 4817. The two electrodes are separated by a gap of approximately one millimeter; the gap extends completely across the disc and consequently has a length of approximately 10.4 millimeters. It should be noted that the sensitivity of the photoconductive cell formed by the two electrodes and the photoconductive material connecting them is proportional to the length of the gap separating the two electrodes and inversely proportional to the square of the width of that gap; thus, the sensitivity of a cell may be varied by adjusting the width of the electrode gap. The electrode coating is then dried; air-drying may be utilized or, if desired, the drying may be accelerated by the use of infra-red lamps, a relatively low-temperature bake out, or other suitable techniques.

*Sensitizing (step 27)*

Figure 2:
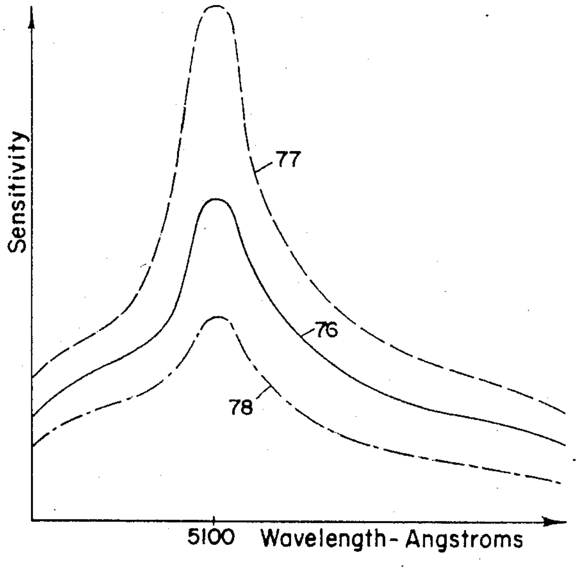
Figure 2 is an explanatory diagram showing changes in cell sensitivity effected by one of the steps of the process of Figure 1.

After the electrodes have been applied in step 26, the photoconductive cell is complete and ready for testing. Frequently, however, it is found that sensitivity of the cell is not as high as desired, apparently due to minor variations in the highly critical sintering process. These cells, however, may be increased in sensititvity to the desired level by the procedure of step 27, which constitutes an important feature of the invention. In this sensitizing step, the cells are baked for approximately fifteen minutes at a temperature of 250 to 325° C. This temperature range is relatively critical; for example, cells treated in this manner show an increase in sensitivity by a factor of 2 to 10 times whereas if the temperature is increased to 350° C. the sensitivity decreases substantially from its original value. In addition, the preferred sensitizing procedure stabilizes the electrical characteristics of the cells to some extent and tends to minimize the gradual increase in dark current frequently observed in untreated cells. The effect of the sensitizing procedure is readily apparent from examination of Figure 2, in which the sensitivity of a sintered cell not subjected to the sensitizing stage of the preferred process is plotted as a function of illumination wavelength, giving the solid curve 76. After sensitization by heating in air at approximately 250° C., the same cell increases markedly in sensitivity, as indicated by dash line curve 77. Air-baking at 350° C., on the other hand, produces a sensitivity characteristic corresponding to the dash-dot curve 78; the cell is made much less sensitive by the higher temperature air bake.

The atmosphere in which the cell is baked during the sensitization procedure of step 27 must of course be compatible with the substances involved. It is believed that the resultant increase in sensitivity observed is due to the removal of excess anion material, sulphur in the present instance, which is present between the grains of the photoconductive material. The particular atmosphere employed may be any of a large group which is capable of accepting excess anion material without reducing the substance of the cell itself; the atmosphere should not of course be one which would result in the introduction of new anion materials into the cell compound nor one which will create a surplus of cations by reducing the cell material. In the present embodiment, the preferred atmosphere is air which has been found to function entirely satisfactorily and which of course is readily available. Other suitable atmospheres include nitrogen, helium and the other noble gases such as argon, neon, krypton and xenon. Thus, the essence of the sensitizing step is the removal of excess material by the application of heat; it is only necessary, as in conventional heating procedures, to select an atmosphere which is compatible with the materials involved.

Complete standardization of the sensitizing procedure may lead to substantial variations between cells which have been subjected to identical processing; a more controlled and individualized procedure is preferred. In this variation of the sensitizing process, the cells are placed on a hot plate maintained at a temperature of approximately 250° C. and connected to an electrical testing circuit which indicates changes in conductivity of the cells as they are heated. As the cells increase in temperature, their photoconductive properties rapidly deteriorate and a relatively high "dark" current is drawn by the cells. This dark current reaches a maximum and, as heating is continued, begins to fall off. By removing the cells from the hot plate and rapidly cooling them to room temperature when they have reached their maximum dark conductivity, the photoconductivity of the cells at room temperature is dramatically improved. By following this procedure, cells which contain a relatively high amount of copper may still be made to exhibit relatively high sensitivity. The heating time required to attain the maximum dark current and the amplitude of this maximum dark current are generally indicative of the photosensitivity which the cell will exhibit at room temperature.

In many instances, it may be desirable to repeat the sensitizing step one or more times, since it has been found that with repeated application of this treatment to the cells the time required to attain the maximum dark current decreases and the sensitivity of the cell increases. As indicated above, cells subjected to this sensitizing treatment are more stable in many characteristics, especially with respect to dark current, than non-treated cells. Highly beneficial results are achievable using air cooling at ambient temperature when the cells are removed from the hot plate, but an even greater improvement in the sensitivity and stability of the cells is obtainable by forced-air cooling of the cells or by otherwise quenching them as by immersing the cells in a suitable oil or other liquid medium which does not react with or otherwise combine with the CdS coating.

In many instances, it has been found that cells exhibit desired sensitivity and dark current characteristics without the sensitizing treatment. It has been determined, however, that these same cells frequently have undesirable time-decay characteristics for the photoconductive current and are less stable than initially relatively insensitive cells treated in accordance with the sensitizing treatment just described.

The characteristics of the originally high-sensitivity cells showing long decay time can be improved by the following treatment: the cells are immersed in or sprayed with a very dilute aqueous solution of a copper salt such as cupric chloride; the $CuCl_2$ concentration may, for example, be of the order of ten parts per million. The cells are then dried and subjected to the sensitizing treatment described above. This copper salt treatment reduces the sensitivity and the dark current drawn by the cells and also materially decreases their decay time.

*Lead connections and housing (step 28)*

After the electrodes have been applied to the cell (step 26) and sensitizing step 27 has been completed, the cells are ready for use. Obviously, however, they require protection from rough handling, etc. Generally speaking, it is not feasible to connect leads to the cell electrodes by soldering or other similar techniques, since the relatively thin conductive electrode layers may easily be destroyed by such a procedure and the photoconductive layer may also frequently be disturbed or its photoconductive properties substantially altered. Accordingly, the cell should be encased in a housing which permits illumination of the photoconductor exposed through the gap between the two electrodes but which provides adequate protection against mechanical damage. It is also preferred that the housing be hermetically sealed, since the cells tend to deteriorate under even moderate humidity conditions. The specific form of casing employed is not critical; a preferred housing and lead structure is described hereinafter in connection with Figures 4 and 5.

Figure 3:
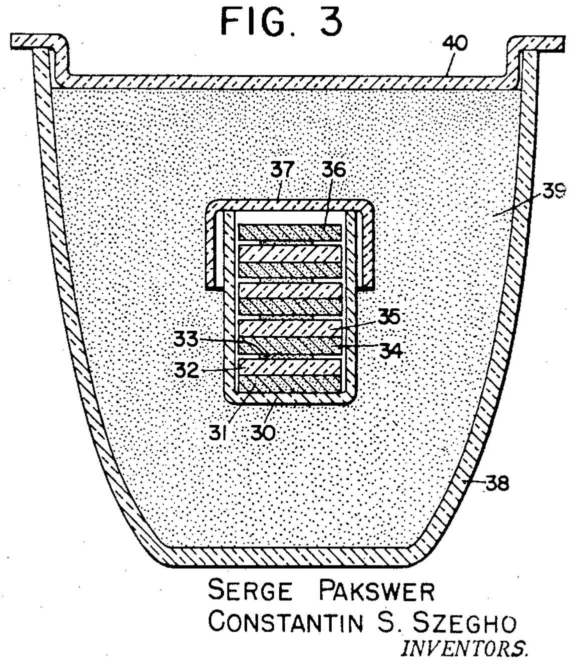
Figure 3 illustrates one form of apparatus which may be employed in the sintering process of Figure 1.

Figure 3 illustrates a typical crucible structure which may be employed in sintering the CdS coating to the glass substrate. The crucible structure comprises a small heat-resistant glass vial 30 having an inside diameter lightly larger than the diameter of the coated glass discs of the cells. In preparing the vial for use in the firing or sintering procedure, a ceramic (for instance an aluminum oxide or steatite ceramic) disc 31 is first placed in the bottom of vial 30. A first glass disc 32 is then placed in vial 30 on top of ceramic disc 31 with the CdS coating 33 on the glass disc facing upwardly. A second ceramic wafer 34 is then placed on top of disc 32, followed by another coated glass disc 35. Further ceramic disc and coated glass disc are deposited in the vial in the same sequence. The last disc is a ceramic wafer 36. A cover 37 of heat-resistant glass or quartz covers the vial 30.

For processing, vial 30 is positioned within a quartz crucible 38 filled with commercial grade CdS powder 39 and covered by a quartz lid 40. The simplest method of emplacing the vial in the illustrated position is to deposit a layer of CdS in crucible 38, place the already-loaded vial 30 on top of the CdS layer, and then fill the remainder of the crucible with CdS powder. The ceramic discs are employed to prevent sintering of the coated glass discs to each other and may be re-used many times. As indicated in the foregoing description of the sintering process, the crucible arrangement of Figure 3 permits the sintering process to be carried out in an atmosphere substantially predominated by the CdS powder and provides for maximum uniformity in the characteristics of the finished cells.

Figure 4:
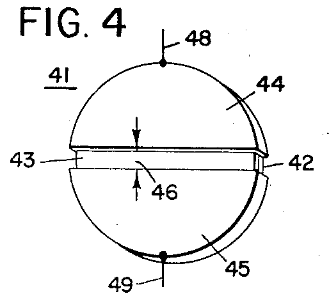
Figure 4 illustrates one cell structure, independent of housing, for a sintered photoconductive cell constructed in accordance with the invention.

Figure 4 shows one form of completed photocell without a housing. The photocell 41 comprises a glass disc 42 which serves as a substrate for the sintered CdS coating 43. The two electrodes 44 and 45 are separated by a gap 46 which, as indicated above, is approximately one millimeter in width and extends across the full diameter of the disc. Electrical connection to the photocell is provided by two leads 48 and 49 which are individually electrically connected to electrodes 44 and 45 respectively, the leads being shown schematically in this view.

In operation, the photocell illustrated in Figure 4 is connected as an impedance in a circuit in which it is desired to control the circuit resistance in response to incident radiation. Illumination of that portion of coating 43 exposed through gap 46 causes the electrical resistance between electrodes 44 and 45 to vary and thus permits control of the circuit characteristics.

Figure 5:
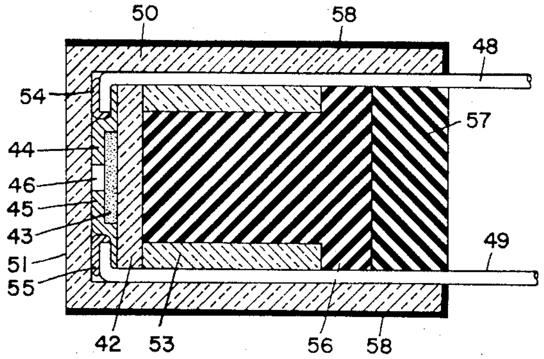
Figure 5 illustrates a preferred form of housing for the cell of Figure 4.

Figure 5 is a cross-sectional view of a preferred form of housing for photocell 41 and shows the basic cell structure comprising glass disc 42, coating 43 and the electrodes 44 and 45 mounted within a cup-shaped casing 50 with gap 46 facing the base portion 51 of the casing. Portion 51 of casing 50 should be highly transparent; the entire casing may be conveniently formed by machining from a rod of polymerized methyl methacrylate, polystyrene or other suitable transparent plastic material. The leads 48 and 49 for the cell are each bent at one end and are mounted in slots in a retaining cylinder 53 and are pressed into contact with electrodes 44 and 45. Good electrical contact is assured by the use of silver paste or other conductive cement at the electrode lead junctions, as indicated by numerals 54 and 55. Cylinder 53 is preferably filled with wax and the wax filling 56 is extended beyond the cylinder to seal the cylinder into casing 50. A heat-resistant wax plug 57 may be employed to cap filler 56. Throughout all the enumerated operations particular care must be taken to work under moisture free conditions. Thus the silver paste contacts must be thoroughly dried by at least one hour storage in a heated cabinet; the glass vials should preferably be pre-heated; it is advantageous to perform all cited operations in a specially dehumidified chamber. The sidewalls and base of the housing are coated with a non-conductive opaque coating 58.

Figure 6:
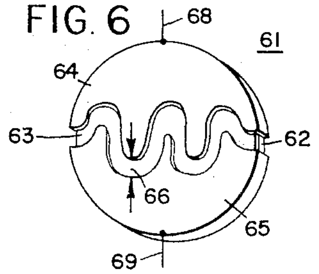
Figure 6 illustrates a preferred form of photocell structure in accordance with the invention.

As noted in connection with the description of step 26 of Figure 1, the sensitivity of the photocell is directly proportional to the length of the gap between its electrodes. In some applications, it is highly desirable to increase the sensitivity by increasing the gap length without enlarging the overall size of the photocell. A preferred structure in which this objective is accomplished is illustrated in Figure 6. The photocell 61 shown in Figure 6 comprises a glass disc 62 which serves as a substrate for a sintered CdS coating 63. The photocell further includes two electrodes 64 and 65 provided with individual leads 68 and 69 respectively. In this construction, however, the simple linear gap 46 of Figure 4 is not employed; rather, a meandering gap 66 is formed between electrodes 64 and 65. Of course, it would be extremely difficult to form a constant-width gap of this configuration by hand painting. It is readily possible, however, to achieve the desired gap configuration by applying electrodes 64 and 65 to the CdS coating by silk screening or similar techniques using a graphite suspension in alcohol known under the commercial tradename of "Neolube." With silk screening, the width of gap 66 may be precisely controlled and the illustrated configuration may be employed to increase the gap length very substantially as compared to the simpler configuration of Figure 4, thus effectively providing materially increased sensitivity in a cell without requiring a corresponding increase in cell dimensions.

Figure 7:
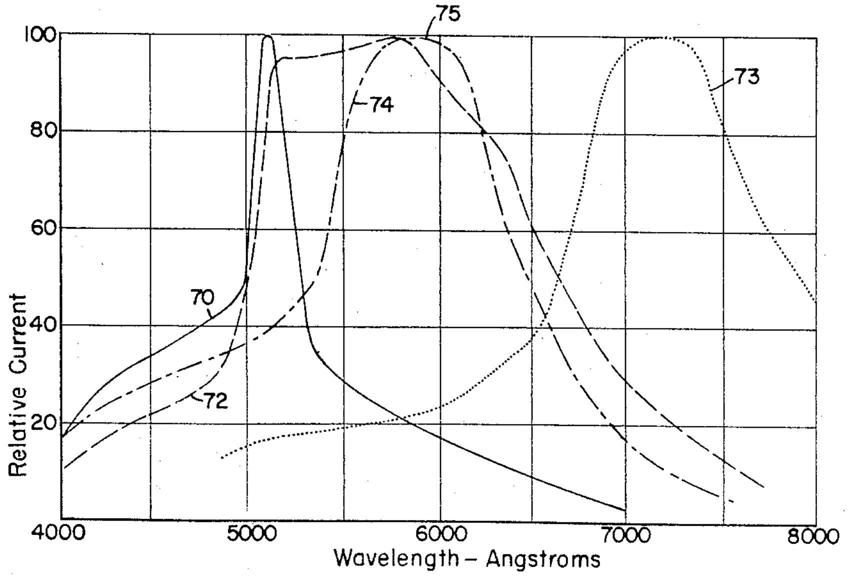
Figure 7 illustrates the spectral response characteristics of cells produced in accordance with different embodiments of the invention.

In Figure 7, the percentage of maximum current translated by a typical photocell manufactured in accordance with the specific technique described above and utilizing the structure of Figure 6 is plotted as a function of the wavelength of incident radiation to illustrate the spectral response characteristics of the cell. This response characteristic, curve 70, shows a sharp response peak at approximately 5100 Angstroms, which is typical of most CdS cells, whether of the evaporated, single-crystal, or sintered types.

Figure 8:
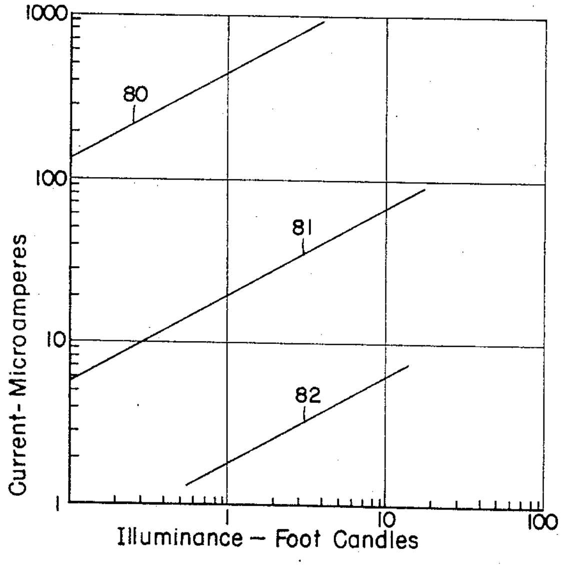
Figure 8 is an explanatory diagram showing the effect of variations in illumination upon the conductivity of a photocell manufactured in accordance with one embodiment of the invention.

In Figure 8, the current translated through a typical cell is shown as a function of incident illumination, both quantities being plotted on logarithmic scales. Curve 80 shows the current for various levels of illumination where the potential difference between the cell electrodes is 100 volts, curve 81 indicates the current values for a potential difference between electrodes 64 and 65 of 10 volts, and curve 82 shows the current values for a voltage difference of 2.5 volts.

Figure 9:
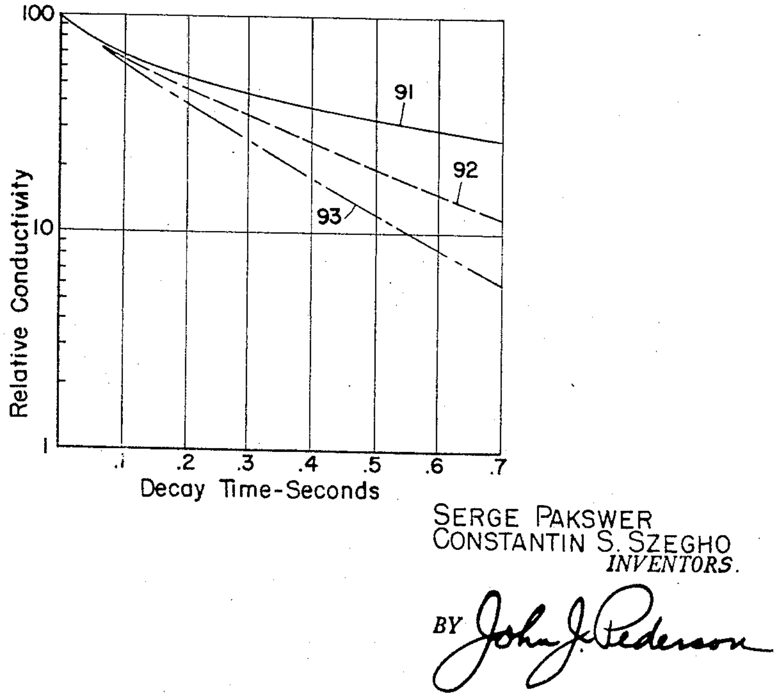
Figure 9 shows the decay time for a typical cell constructed in accordance with the invention under various conditions of illumination.

Figure 9 illustrates the decay time characteristics of a typical cell manufactured in accordance with the detailed description of the inventive method set forth above. In this figure, relative conductivity of the cell is plotted as a function of decay time, the maximum conductivity value for a given illumination level being taken as 100 on the arbitrary logarithmic ordinate scale. A first curve 91 shows the decrease in conductivity following a period in which the cell has been illuminated to an intensity of 0.3 foot-candles; as indicated by curve 91, the conductivity decreases to approximately 28% of its maximum value within approximately 0.7 second. Curve 92 is similar to characteristic 91 except that it indicates the percentage decay in conductivity where the cell has been illuminated to an intensity of 3 foot candles. In this instance, conductivity of the cell decreases to approximately 12% of maximum within the 0.7 second period shown on the graph. The third characteristic curve 93 of Figure 9 illustrates the extent of decrease in conductivity from maximum where the illumination level has been approximately 40 foot candles; in this case, at the end of the 0.7 second decay period shown in the figure, conductivity decreases to approximately 6% of maximum. It is thus apparent that cells manufactured in accordance with the inventive technique are fast enough in response to suit many industrial and/or commercial applications. For example, the decay characteristics shown in Figure 9 are clearly adequate for door opening and similar one-shot applications and for any industrial process in which operation of a controlled circuit need not occur at intervals shorter than 0.7–1.0 second.

Figure 10:
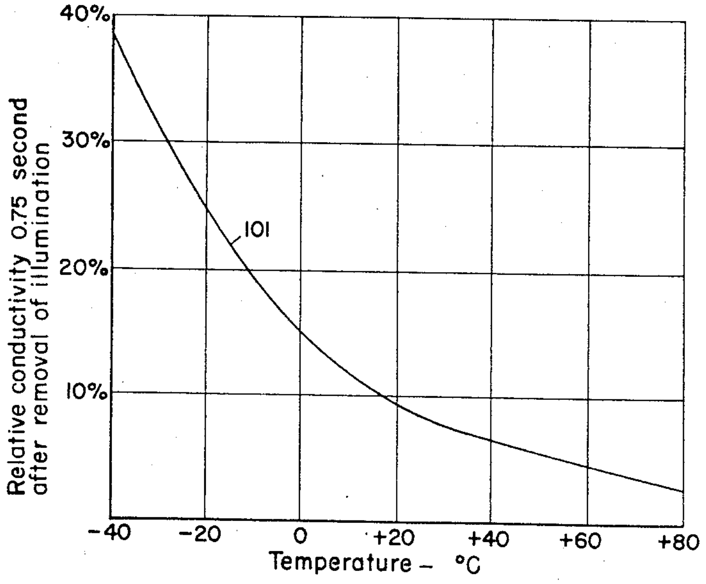
Figure 10 is an explanatory diagram illustrating the effect of temperature upon the decay time of a typical cell manufactured in accordance with the invention.

Figure 10 illustrates the effect of temperature changes upon the decay time characteristics of sintered CdS cells manufactured in accordance with the techniques set forth in detail above. In this figure, the curve 101 comprises a plot of relative conductivity at a time 0.75 second subsequent to removal of illumination, of 15 foot candles, of the cell as a function of temperature in degrees centigrade. At relatively low temperatures, conductivity remains fairly high after this relatively short time interval; for example, at −30° C., the conductivity of the cell may still be approximately 30% of the maximum value reached during illumination. At somewhat higher operating temperatures, however, including those within the normal ambient range, the conductivity decreases much more rapidly. Thus, at normal room temperature of 25° C., the conductivity of the cell decreases to approximately 8% of maximum at the end of the 0.75 second decay period.

Figure 11:
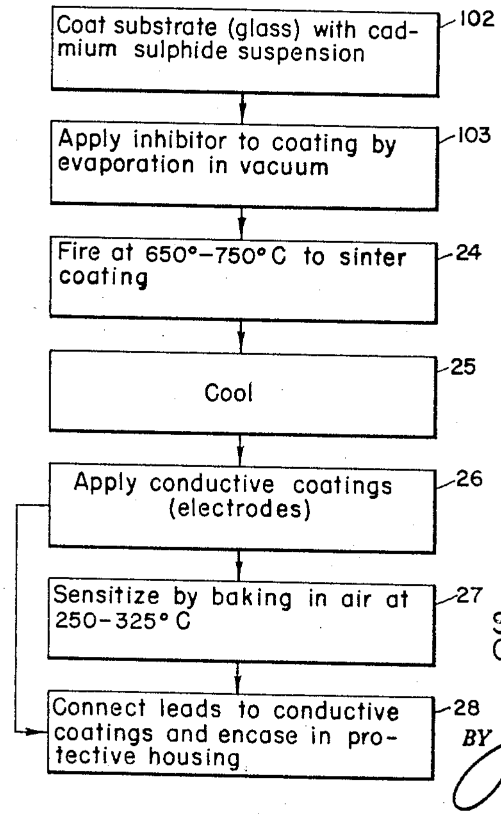
Figure 11 is a flow chart illustrating the process steps included in another embodiment of the invention.

Figure 11 illustrates a second embodiment of the inventive process which is in many respects quite similar to the embodiment of Figure 1 but which may be employed to produce sintered CdS cells having markedly different spectral response characteristics. In this embodiment of the invention, a suitable substrate such as glass disc 42 (Figure 4) is first coated with a CdS suspension which has not been treated or "doped" with an inhibitor modifier such as copper, silver or manganese. In all other respects, step 102 may be essentially similar to stages 22 and 23 of the process illustrated by the flow chart of Figure 1. After the substrate has been coated and the coating has been dried, an inhibitor modifier such as copper is applied to the coating by evaporation, preferably in a vacuum. Only a relatively thin coating of copper should be evaporated upon the surface of the CdS; the exact amount is, of course, dependent on the original impurity content of the CdS but may be readily determined empirically. For a cell of the type described above in connection with Figures 4–6, the copper is evaporated to a transmission of approximately 50–60% roughly corresponding to $1 \times 10^{-3}$ mgrs./cm.$^2$.

The remaining steps in the process illustrated in Figure 11 are essentially similar to those of Figure 1. Thus, after the inhibitor has been evaporated onto the CdS coating in step 103, the coated substrate is fired at a temperature of 650–750° C., in an atmosphere controlled by surrounding the substrate with CdS, to sinter the coating to the substrate in step 24. The sintered coating and substrate are then cooled, preferably to room temperature (step 25), after which suitable conductive coatings or electrodes are applied in the same manner as described in connection with step 26 in the previous embodiment. The cells may then, optionally, be sensitized by baking in air or other suitable atmosphere at 250–325° C. in step 27. Suitable leads may then be connected to the electrodes and the cell may be encased in a transparent housing as described in connection with step 28.

The spectral response characteristics of cells manufactured in accordance with the process illustrated by the flow chart of Figure 11 are indicated by the dash line 72 in Figure 7. As shown by curve 72, these cells exhibit a substantially greater relative response in the red portion of the visible spectrum than the cells processed in accordance with the process of Figure 1 and do not show the peaked response at 5100 Angstroms typical of CdS cells. In most instances, the amount of copper doping required to provide reasonably short decay time in these evaporated-inhibitor cells is relatively large; consequently, their sensitivity is substantially lower than that of cells produced by the process of Figure 1. In many applications, however, particularly where the sensitivity requirements are not too stringent, these cells are quite advantageous as compared to conventional CdS cells or to the sintered cells produced by the first-described embodiment of the invention because of their broader spectral response characteristics.

It is also possible to obtain photocells having relatively high response in the red portions of the spectrum by utilizing cadmium selenide as the photoconductor rather than cadmium sulfide. CdSe may be substituted completely for CdS in the embodiment of Figure 1 without requiring any change in the sequence or general nature of most of the fundamental process steps. As in the case of CdS, the CdSe is suspended in water to form a paste or slurry and in then modified by the addition of suitable donor and inhibitor impurities. The impurity content should be approximately the same as for CdS cells, and may, for example, comprise approximately $1 \times 10^{-3}$ gram chlorine per gram CdSe and $1 \times 10^{-3}$ gram copper per gram CdSe. The modified CdSe suspension is then applied to a suitable substrate, dried, and fired to sinter the coating to the substrate. Thereafter, the cells are cooled, the electrodes are applied and suitable leads are connected to the electrodes. Sintering of the CdSe cells may be carried out in an atmosphere predominated by the presence of cadmium sulfide, but cadmium selenide is preferably employed for this purpose.

There are two principal differences between the process as applied to CdSe and CdS cells. In the first place, the sintering temperature must be substantially higher for CdSe; it has been found necessary to heat the cadmium selenide cells to a much higher temperature to achieve the desired sintering action. The requisite temperature range is approximately 800° C. to 900° C.; best results are usually attained at a firing temperature of approximately 870° C. Consequently, it is not possible to use glass as a substrate for the cells, since the glass would melt at the required sintering temperature. For these CdSe cells, therefore, it is necessary to use fused quartz or some other substrate material capable of withstanding the extreme firing temperatures involved. In addition, it should be noted that the sensitizing step 27 of Figure 1 is not uniformly effective as applied to the CdSe cells and may be omitted from the process.

The spectral response characteristics for CdSe cells manufactured in accordance with the embodiment of Figure 1 are indicated by short-dash line 73 in Figure 7. As shown by curve 73, these cells have a relatively higher response in the red portion of the spectrum and substantially lesser response in the blue portion as compared to CdS cells. The cadmium selenide cells also exhibit useful response characteristics at the lower infra-red wavelengths, so that they may be actuated by infra-red radiations where desired. Sensitivity of the cells is comparable to that of the sintered CdS cells described in detail above; they are also similar to the CdS cells in their decay-time characteristics, except that decay time on the CdSe cells is usually shorter. Consequently, the CdSe cells are preferable for applications in which speed of response is an important factor.

Another highly important variation of the inventive process involves the use of both CdS and CdSe in the basic photoconductive material. For example, the suspension formed in step 20 of Figure 1 may comprise a 50–50 mixture CdS and CdSe. This mixed suspension may be doped with copper and chlorine as described in detail in connection with step 21 of the flow chart; preferably, the copper content is again made approximately equal to $1\times10^{-3}$ gram copper per gram of the CdS-CdSe mixture. As in the previous embodiments, the modified suspension is applied to a suitable substrate and the remainder of the process steps illustrated in Figure 1 are employed in fabricating the cell. CdS may be used as the atmosphere-controlling material surrounding the cells during sintering (step 24); CdSe or a CdSe-CdS mixture may also be employed.

The basic process of Figure 1 need not be modified in any essential detail where the photoconductor comprises a mixture of substantial quantities of both CdS and CdSe. The firing temperature necessary for sintering remains within the 650–750° C. range, even where CdSe constitutes the major ingredient of the photoconductor. Consequently, it is possible to use glass as a substrate for the CdS-CdSe cells, thus materially reducing the cost as compared with cells in which CdSe alone comprises the photoconductor. In addition, the sensitizing procedure of step 27 is quite useful in processing the mixed-photoconductor cells and affords essentially the same advantages as indicated above in the description of CdS processing. These CdS-CdSe cells show the same high sensitivity and short decay time characteristics as the CdSe cells and, consequently, may be employed in a wide variety of control applications.

The spectral response characteristics for a typical mixed-photoconductor cell are illustrated by dot-dash curve 74 in Figure 7. The red response is, as might be expected, somewhat lower than that for CdSe cells and substantially greater than that of the CdS cells. Actually, the peak response wavelength for the CdS-CdSe cells may be varied as desired between the characteristic 5100 Angstrom CdS peak and the 7200 Angstrom CdSe peak by varying the proportions of the two photoconductors in the cell. Accordingly, these mixed-photoconductor cells may be employed to achieve any desired spectral response peak within a relatively wide range.

It will thus be appreciated that photosensitive devices manufactured in accordance with the invention are relatively simple and inexpensive to manufacture. The inventive methods yield devices which are comparatively stable in sensitivity and in their unilluminated impedance. Furthermore, the resultant sensitivity of the devices is subject to very accurate control, and the resultant spectral response may be fixed at any wavelength region within a relatively broad range. In addition, the spectral-width of the response region may be varied to accommodate different requirements.

While particular embodiments of the present invention have been shown and described, it is apparent that numerous variations and modifications may be made, and it is therefore comtemplated in the appended claims to cover all such variations and modifications as fall within the true spirit and scope of the invention.

We claim:

1. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate in an atmosphere containing at least one of the group consisting of sulfur and selenium at a temperature above 650° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

2. The method of manufacturing photosensitive impedance devices comprising the following steps: suspending photoconductor material, consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese, in water to form a photoconductor slurry; coating a substrate with said photoconductor slurry; firing said coated substrate in an atmosphere containing at least one of the group consisting of sulfur and selenium at a temperature above 650° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

3. The method of manufacturing photosensitive impedance devices comprising the following steps: mixing together powdered cadmium sulfide, a chloride, a copper salt, and water to form a photoconductor slurry in which the chlorine and copper concentrations are of the order of $1\times10^{-3}$ gram per gram cadmium sulfide; coating a substrate with said photoconductor slurry; firing said coated substrate in an atmosphere containing sulfur at a temperature within the range of 650–750° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

4. The method of manufacturing photosensitive impedance devices comprising the following steps: mixing together powdered cadmium selenide, a chloride, a copper salt, and water to form a photoconductor slurry in which the copper and chlorine concentrations are of the order of $1\times10^{-3}$ gram per gram cadmium selenide; coating a substrate with said photoconductor slurry; firing said coated substrate in an atmosphere containing at least one of the group consisting of sulfur and selenium at a temperature within the range of 800–900° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

5. The method of manufacturing photosensitive impedance devices comprising the following steps: mixing together powdered cadmium sulfide, powdered cadmium selenide, a chloride, a copper salt and water to form a photoconductor slurry in which the copper and chlorine concentrations are in the order of $1 \times 10^{-3}$ gram per gram cadmium sulfide plus cadmium selenide; coating a substrate with said photoconductor slurry; firing said coated substrate in an atmosphere containing sulfur at a temperature within the range of 650–750° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

6. The method of manufacturing photosensitive impedance devices comprising the following steps: coating a substrate with a photoconductor consisting primarily of cadmium sulfide and including minor portions of a donor element selected from the group consisting of elements from the third and seventh columns of the periodic table and an inhibitor element selected from the group consisting of copper, silver and manganese; surrounding said coated substrate with powdered cadmium sulfide; firing said cadmium-sulfide-surrounded coated substrate at a temperature within the range of 650–750° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor.

7. The method of manufacturing photosensitive impedance devices comprising the following steps: coating a substrate with a photoconductor consisting primarily of cadmium selenide and including minor portions of a donor element selected from the group consisting of elements from the third and seventh columns of the periodic table and an inhibitor element selected from the group consisting of copper, silver and manganese; surrounding said coated substrate with powdered cadmium selenide; firing said cadmium-sulfide-surrounded coated substrate at a temperature within the range of 800–900° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

8. The method of manufacturing photosensitive impedance devices comprising the following steps: coating a substrate with a photoconductor consisting primarily of cadmium sulfide and cadmium selenide and including minor portions of a donor element selected from the group consisting of elements from the third and seventh columns of the periodic table and in inhibitor element selected from the group consisting of copper, silver and manganese; surrounding said coated substrate with powdered cadmium sulfide; firing said cadmium-sulfide-surrounded coated substrate at a temperature within the range of 650–750° C. for a time sufficient to sinter said photoconductor coating to said substrate and to develop photoconductive properties in said coating; and applying two spaced conductive elements to said photoconductor coating to form a pair of electrodes electrically interconnected by said sintered photoconductor coating.

9. The method of manufacturing photosensitive impedance devices comprising the following steps: coating a substrate with a photoconductor consisting primarily of cadmium sulfide and including minor portions of a donor element selected from the group consisting of elements from the third and seventh columns of the periodic table and an inhibitor element selected from the group consisting of copper, silver and manganese; firing said coated substrate in an atmopshere containing sulfur at a temperature of approximately 710° C. for a period of ½ to 2 hours to sinter said photoconductor coating to said substrate and to develop photoconductive properties in said coating; and applying two spaced conductive elements to said photoconductor coating to form a pair of electrodes electrically interconnected by said sintered photoconductor coating.

10. The method of manufacturing photosensitive impedance devices comprising the following steps: coating a substrate with a photoconductor consisting primarily of a mixture of cadmium sulfide and cadmium selenide and including minor portions of a donor element selected from the group consisting of elements from the third and seventh columns of the periodic table and an inhibitor element selected from the group consisting of copper, silver and manganese; firing said coated substrate in an atmosphere containing sulfur at a temperature of approximately 710° C. for a period of ½ to 2 hours to sinter said photoconductor coating to said substrate and to develop photoconductive properties in said coating; and applying two spaced conductive elements to said photoconductor coating to form a pair of electrodes electrically interconected by said sintered photoconductor coating.

11. The method of manufacturing photosensitive impedence devices comprising the following steps: coating a substrate with a photoconductor consisting primarily of cadmium selenide and including minor portions of a donor element selected from the group consisting of elements from the third and seventh columns of the periodic table and an inhibitor element selected from the group consisting of copper, silver and manganese; firing said coated substrate in an atmosphere containing selium at a temperature of approximately 870° C. for a period of ½ to 2 hours to sinter said photoconductor coating to said substrate and to develop photoconductive properties in said coating; and applying two spaced conductive elements to said photoconductor coating to form a pair of electrodes electrically interconnected by said sintered photoconductor coating.

12. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate at a temperature above 650° C. for a time sufficient to sinter said photoconductor coating to said substrate and to develop photoconductive properties in said coating; applying two spaced conductive elements to said photoconductor coating to form a pair of electrodes electrically interconnected by said sintered photoconductor coating; and sensitizing said sintered photoconductor coating by heating to a temperature of 250–325° C. for a predetermined period to increase the photosensitivity of said coating.

13. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate in an atmosphere containing at least one of the group consisting of sulfur and selenium at a temperature above 650° C. for a time sufficient to sinter said photoconductor coating to said substrate and to develop photoconductive properties in said coating; applying two spaced conductive elements to said photoconductor coating to form a pair of electrodes electrically interconnected by said sintered photoconductor coating; and sensitizing said sintered photoconductor coating by heating to a temperature of 250–325° C. for a predetermined period to increase the photosensitivity of said coating.

14. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate at a temperature above 650° C. for a time sufficient to sinter said photoconductor coating to said substrate and to develop photoconductive properties in said coating; applying two spaced conductive elements to said photoconductor coating to form a pair of electrodes electrically interconnected by said sintered photoconductor coating; heating said sintered photoconductor coating at a temperature of 250–325° C. for a predetermined period; and quenching said coating to an ambient temperature immediately thereafter to increase the photosensitivity of said coating.

15. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate at a temperature above 650° C. for a time sufficient to sinter said photoconductor coating to said substrate and to develop phtoconductive properties in said coating; applying two spaced conductive elements to said photoconductor coating to form a pair of electrodes electrically interconnected by said sintered photoconductor coating; heating said sintered photoconductor coating to a temperature of 250–325° C. for a predetermined period; and rapidly cooling said coating by quenching said coated substrate in a neutral liquid immediately thereafter to increase the photosensitivity of said coating.

16. The method of manufacturing photosensitive impedance devices comprising the following steps: coating a substrate with a photoconductor consisting primarily of at least one compound from the group consisting of cadmium sulfide and cadmium selenide and including minor portions of a donor element selected from the group consisting of elements from the third and seventh columns of the periodic table and an inhibitor element selected from the group consisting of copper, silver and manganese; firing said coated substrate at a temperature above 650° C. for a time sufficient to sinter said photoconductor coating to said substrate and to develop photoconductive properties in said coating; applying two spaced conductive elements to said photoconductor coating to form a pair of electrodes electrically interconnected by said sintered photoconductor coating; heating said sintered photoconductive coating to a temperature of 250–325° C. until said coating exhibits maximum dark conductivity; and quenching said coating to ambient temperature immediately thereafter to increase the photosensitivity of said coating.

17. In the manufacture of a photosensitive impedance device comprising a sintered layer of photoconductive material selected from the group consisting of cadmium sulfide, cadmium selenide, and a mixture of cadmium sulfide and cadmium selenide, the method of sensitizing said impedance device which comprises heating said impedance device to a temperature of 250–325° C. for a predetermined period.

18. In the manufacture of a photosensitive impedance device comprising a sintered layer of photoconductive material selected from the group consisting of cadmium sulfide, cadmium selenide, and a mixture of cadmium sulfide and cadmium selenide, the method of sensitizing said impedance devices which comprises heating said impedance device to a temperature of 250–325° C. for a predetermined period and immediately thereafter quenching said impedance device to ambient temperature.

19. In the manufacture of a photosensitive impedance device comprising a sintered layer of photoconductive material selected from the group consisting of cadmium sulfide, cadmium selenide, and a mixture of cadmium sulfide and cadmium selenide, the method of sensitizing said impedance device which comprises heating said impedance device at a temperature 250–325° C. for a predetermined period and immediately thereafter quenching said device in a neutral liquid.

20. In the manufacture of a photosensitive impedance device comprising a sintered layer of photoconductive material selected from the group consisting of cadmium sulfide and a mixture of cadmium sulfide and cadmium selenide, the method of sensitizing said impedance device which comprises heating said impedance device to a temperature of approximately 250° C. until the dark conductivity of said device attains a maximum value and immediately thereafter quenching said device to room temperature.

21. In the manufacture of a photosensitive impedance device comprising a sintered layer of photoconductive material selected from the group consisting of cadmium sulfide, cadmium selenide, and a mixture of cadmium sulfide and cadmium selenide, the method of adjusting the sensitivity of said impedance device which comprises the following steps: immersing the surface of said sintered layer of photoconductive material in a dilute solution of a copper salt; heating said impedance device to a temperature of 250–325° C. for a predetermined period; and thereafter quenching said device to ambient temperature.

22. In the manufacture of a photosensitive impedance device comprising a sintered layer of photoconductive material selected from the group consisting of cadmium sulfide, cadmium selenide, and a mixture of cadmium sulfide and cadmium selenide, the method of adjusting the sensitivity of said impedance device which comprises the following steps: dipping said impedance device in an aqueous solution of cupric chloride having a concentration of the order of ten parts per million; heating said impedance device to a temperature of 250–325° C. for a predetermined period; and immediately thereafter quenching said impedance device to ambient temperature.

23. In the manufacture of a photosensitive impedance device comprising a sintered layer of photoconductive material selected from the group consisting of cadmium sulfide, cadmium selenide, and a mixture of cadmium sulfide and cadmium selenide, the method of adjusting the sensitivity of said impedance device comprising the following steps: spraying said sintered photoconductive layer with a highly dilute solution of cupric chloride; heating said impedance device to a temperature of 250–325° C. for a predetermined period; and immediately thereafter quenching said impedance device to room temperature.

24. The method of manufacturing photosensitive cadmium sulfide impedance devices comprising the following steps: coating a substrate with a material consisting primarily of cadmium sulfide and including minor portions of a donor element selected from the group consisting of elements from the third and seventh columns in the periodic table; evaporating an inhibitor element selected from the group consisting of copper, silver and manganese onto said coating; firing said coated substrate at a temperature of 650–750° C. for a predetermined period to sinter said coating to said substrate and develop photoconductive properties in said coating; and applying two spaced conductive elements to said sintered coating to form a pair of electrodes electrically interconnected by said sintered cadmium sulfide coating.

25. The method of manufacturing photosensitive cadmium sulfide impedance devices comprising the following steps: coating a substrate with a material consisting primarily of cadmium sulfide and including minor portions of a donor element selected from the group consisting of elements from the third and seventh columns in the periodic table; evaporating an inhibitor element selected from the group consisting of copper, silver and manganese onto said coating; firing said coated substrate at a temperature of 650–750° C. for a predetermined period to sinter said coating to said substrate and develop photoconductive properties in said coating; applying two spaced conductive elements to said sintered coating to form a pair of electrodes electrically interconnected by said sintered cadmium sulfide coating; and sensitizing said sintered photoconductor coating by heating to a temperature of 250–325° C. for a predetermined period to increase the photosensitivity of said coating.

26. The method of manufacturing photosensitive cadmium sulfide impedance devices comprising the following steps: coating a substrate with a material consisting primarily of cadmium sulfide and including minor portions of a donor element selected from the group consisting of elements from the third and seventh columns in the periodic table; evaporating an inhibitor element selected from the group consisting of copper, silver and manganese onto said coating; firing said coated substrate in an atmosphere containing sulfur at a temperature of approximately 710° C. for a predetermined period to sinter said coating to said substrate and develop photoconductive properties in said coating; and applying two spaced conductive elements to said sintered coating to form a pair of electrodes electrically interconnected by said sintered cadmium sulfide coating.

References Cited in the file of this patent

UNITED STATES PATENTS

| | | |
|---|---|---|
| 2,688,564 | Forgue | Sept. 7, 1954 |
| 2,765,385 | Thomsen | Oct. 2, 1956 |